United States Patent
Zhou

(10) Patent No.: US 8,532,717 B2
(45) Date of Patent: Sep. 10, 2013

(54) VOLTAGE INDICATING CIRCUIT FOR MOBILE PHONE BATTERY

(75) Inventor: Shilei Zhou, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/488,675

(22) Filed: Jun. 5, 2012

(65) Prior Publication Data

US 2012/0295669 A1 Nov. 22, 2012

Related U.S. Application Data

(63) Continuation of application No. PCT/CN2010/075362, filed on Jul. 21, 2010.

(30) Foreign Application Priority Data

Dec. 9, 2009 (CN) ...................... 2009 2 0174321 U

(51) Int. Cl.
*H04W 88/02* (2009.01)
(52) U.S. Cl.
USPC ......... 455/572; 455/573; 455/343.5; 320/162
(58) Field of Classification Search
USPC ............... 455/572, 573, 343.5; 320/134, 162
See application file for complete search history.

(56) References Cited

U.S. PATENT DOCUMENTS

| 4,316,185 | A | 2/1982 | Watrous et al. | 340/636 |
| 6,522,900 | B1 | 2/2003 | Cho | 455/572 |
| 2001/0003091 | A1* | 6/2001 | Higuchi | 455/260 |
| 2009/0080503 | A1* | 3/2009 | Wenzel et al. | 375/219 |
| 2009/0295230 | A1* | 12/2009 | Rousu et al. | 307/80 |

FOREIGN PATENT DOCUMENTS

| CN | 1290862 A | 4/2001 |
| EP | 0388523 A2 | 11/1989 |

* cited by examiner

*Primary Examiner* — Cong Tran
(74) *Attorney, Agent, or Firm* — Christopher P. Maiorana, PC

(57) ABSTRACT

The present invention discloses voltage indicating circuit for mobile phone battery, comprising: a battery, a mobile phone baseband module and a battery voltage detection module, wherein power input terminals of the mobile phone baseband module and battery voltage detection module are coupled with an anode of the battery, and a detection signal output terminal of the battery voltage detection module is coupled with a communication terminal of the mobile phone baseband module; the battery voltage detection module detects an output voltage of the anode of the battery and outputs a mobile phone battery voltage detection signal to the mobile phone baseband module through the detection signal output terminal; and the mobile phone baseband module receives the mobile phone battery voltage detection signal through the communication terminal and indicates a voltage of the battery according to the mobile phone battery voltage detection signal.

5 Claims, 2 Drawing Sheets

VOLTAGE INDICATING CIRCUIT FOR MOBILE PHONE BATTERY

This is a continuation of International Application PCT/CN2010/075362, with an International Filing Date of Jul. 21, 2010, which claims priority to Chinese Application No. 200920174321.8, filed Dec. 9, 2009, each of which is incorporated by reference.

FIELD OF THE INVENTION

The present invention relates to communication equipment, in particular to a voltage indicating circuit for a mobile phone battery.

BACKGROUND OF THE INVENTION

When a mobile phone is used, voltage of a mobile phone battery needs to be monitored in real time. There is generally a graphic indicator for the voltage or quantity of electricity of the battery on an interface of the mobile phone, and a user can judge a current status of the battery according to the indication icon. Moreover, it is necessary to give the user an alarm or a power-off prompt in a case of low voltage of the battery.

At present, a manner of Analog-Digital (A/D) conversion is generally used for detection on the circuit, specifically comprising: the voltage of the battery is firstly input to an A/D conversion module to be converted into a digital quantity and then transferred, by a system bus, to a mobile phone baseband module to be processed by software; and the software judges the range of the voltage of the battery by table lookup or comparison and then refreshes the icon on the interface according to the judgment result.

FIG. 1 is a block diagram of a common method for implementing a grading indicating circuit for the voltage of the battery. As shown in FIG. 1, the grading indicating circuit for the voltage of the battery is implemented by A/D conversion, and ADC in FIG. 1 represents an A/D converter.

In implementation, the defects of the above method lie in: the current voltage value of the battery needs to be acquired by continuous query of the software, a time interval for each query is variable, and the query needs to be controlled by a processor thereby consuming resources of the processor; in addition, various errors are easy to be introduced as the A/D conversion needs the cooperation of a clock, therefore, it is necessary to calibrate the voltage of the battery of each mobile phone in a later period.

SUMMARY OF THE INVENTION

The present invention provides a voltage indicating circuit for a mobile phone battery to solve the problem of consuming the resources of the processor caused by querying the voltage of the battery by the software in the prior art.

An embodiment of the present invention provides a voltage indicating circuit for a mobile phone battery, comprising a battery, further comprising a mobile phone baseband module and a battery voltage detection module, wherein power input terminals of the mobile phone baseband module and the battery voltage detection module are coupled with an anode of the battery, and a detection signal output terminal of the battery voltage detection module is coupled with a communication terminal of the mobile phone baseband module;

the battery voltage detection module detects an output voltage of the anode of the battery and outputs a mobile phone battery voltage detection signal to the mobile phone baseband module through the detection signal output terminal; and the mobile phone baseband module receives the mobile phone battery voltage detection signal through the communication terminal and indicates a voltage of the battery according to the mobile phone battery voltage detection signal.

Preferably, the detection signal output terminal of the battery voltage detection module comprises at least two interrupt signal output terminals, the communication terminal of the mobile phone baseband module comprises at least two signal receiving terminals, and the interrupt signal output terminals and the signal receiving terminals are coupled in a one-to-one correspondence way; and the battery voltage detection module outputs a group of corresponding interrupt signals through the at least two interrupt signal output terminals according to a position of the detected output voltage of the anode of the battery in preset different voltage ranges, and the mobile phone baseband module displays a range in which the voltage of the battery is located according to the group of interrupt signals received.

Preferably, there are two interrupt signal output terminals and two signal receiving terminals respectively.

Preferably, the communication terminal of the mobile phone baseband module is universal Input/Output (I/O) interfaces of a mobile phone baseband main chip.

Preferably, the battery voltage detection module comprises:

a first Low Dropout Regulator LDO (411) with an input terminal coupled with the anode of the battery and an output terminal being Vth1;

a second LDO (412) with an input terminal coupled with the anode of the battery and an output terminal being Vth2;

resistors R1, R2 and R3 coupled in series to form a first branch, wherein one terminal of the first branch is coupled with the anode of the battery and the other terminal of the first branch is grounded, and the output voltage of the anode of the battery is output as Vin1 and Vin2 after being divided by the first branch;

resistors R4, R5 and R6 coupled in series to form a second branch, wherein one terminal of the second branch is coupled with the anode of the battery and the other terminal of the second branch is grounded, and the output voltage of the anode of the battery is output as Vin3 and Vin4 after being divided by the second branch;

a first voltage comparator (413) with an in-phase input terminal coupled with the Vth1, an inversed-phase input terminal coupled with the Vin1, and an output terminal being O1;

a second voltage comparator (414) with an in-phase input terminal coupled with the Vin2, an inversed-phase input terminal coupled with the Vth2, and an output terminal being O2;

a third voltage comparator (415) with an in-phase input terminal coupled with the Vth1, an inversed-phase input terminal coupled with the Vin3, and an output terminal being O3;

a fourth voltage comparator (416) with an in-phase input terminal coupled with the Vin4, an inversed-phase input terminal coupled with the Vth2, and an output terminal being O4;

a first RS trigger (417) with an S interface coupled with the O1, an R interface coupled with the O2, and an output terminal being one interrupt signal output terminal of the battery voltage detection module; and a second RS trigger (418) with an S interface coupled with the O3, an R interface coupled with the O4, and an output terminal being the other interrupt signal output terminal of the battery voltage detection module.

The present invention has the following advantages:

with the circuit provided by the embodiment of the present invention, the range in which the voltage of the battery is located can be obtained directly by the battery voltage detection module having a hysteresis function without the cooperation of a clock, the indication of the voltage of the battery can be refreshed quickly by transmitting the range to the universal I/O interfaces of the mobile phone baseband main chip through interruptions, and the current voltage value of the battery can be acquired without the continuous query of the software, so as to effectively reduce the burden of the software and solve the problems of dependency of A/D conversion on the clock and conversion error.

DETAILED DESCRIPTION OF THE EMBODIMENTS

To solve the problem of consuming resources of a processor by querying the voltage of a battery by the software in the prior art, the technical solution provided by the embodiments of the present invention provides a voltage indicating circuit, having the hysteresis function, for a mobile phone battery, which detects the voltage of the battery completely by the hardware, has the hysteresis function, and can run in an interruption way. The embodiments of the present invention will be described below with reference to the drawings.

Figure 1:
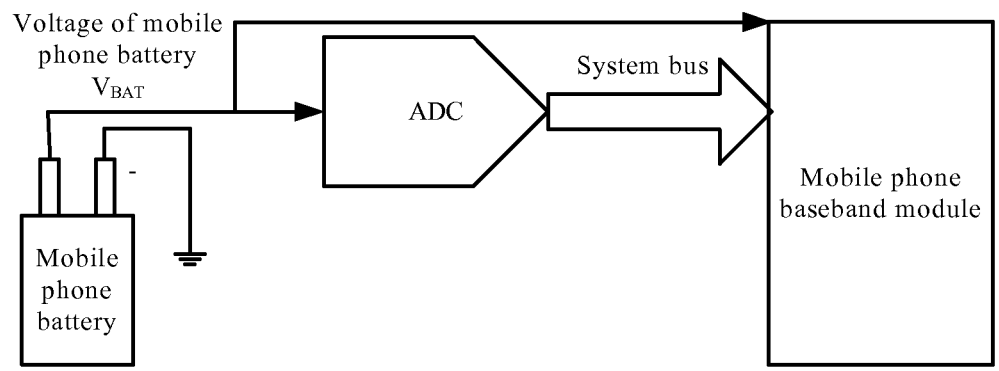
FIG. 1 is a block diagram of a common method for implementing a grading indicating circuit for the voltage of the battery in the background.
Figure 2:
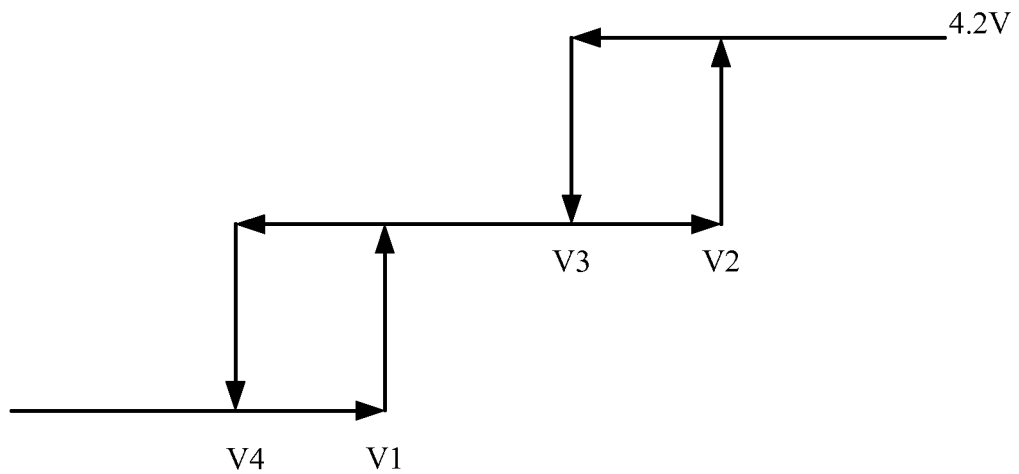
FIG. 2 is a schematic diagram showing the relationship between the voltage of the battery and the indication of the mobile phone in accordance with an embodiment of the present invention.

FIG. 2 is a schematic diagram showing the relationship between the voltage of a battery and an indication of a mobile phone. Due to the grading of the voltage of the mobile phone battery may be different in different mobile phones, in this embodiment, it is assumed that the voltage of the battery is graded into 3 levels (upward direction: below V1, V1 to V2, and V2 to 4.2V; and downward direction: V3 to 4.2V, V3 to V4, and below V4), and corresponding indication bars of the voltage of the battery are:

upward direction, below V1: 0 bar, V1 to V2: 1 bar, and V2 to 4.2V: 2 bars; and downward direction, V3 to 4.2V: 2 bars, V3 to V4: 1 bar, and below V4: 0 bar.

FIG. 2 is merely a specific implementation, and other changes can be made. For example, the jump threshold of a signal indication at upward direction is less than that of downward direction, i.e., V1<V4, and V2<V3. Moreover, the solution provided this embodiment is also suitable for other grading ways.

Figure 3:
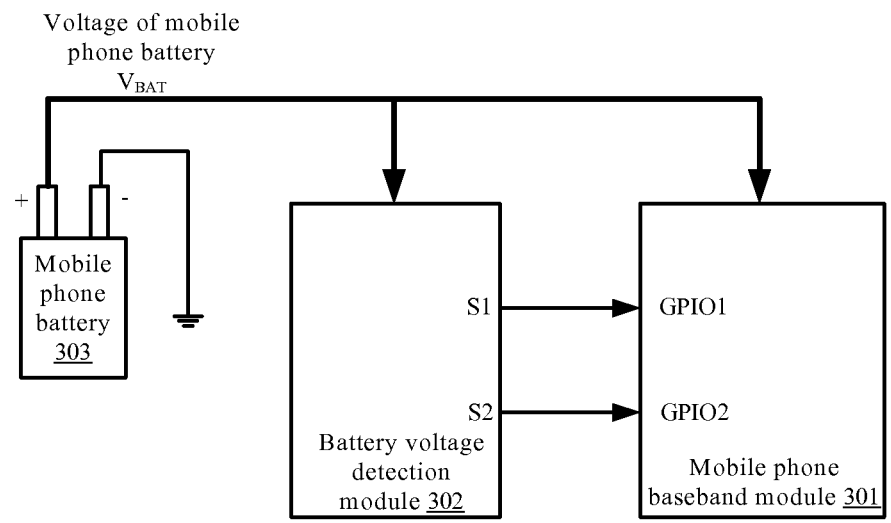
FIG. 3 is a schematic diagram showing the structure of a voltage indicating circuit for a mobile phone battery in accordance with an embodiment of the present invention.

FIG. 3 is schematic diagram showing the structure of a voltage indicating circuit for a mobile phone battery. As shown in FIG. 3, the circuit comprises: a mobile phone baseband module 301, a battery voltage detection module 302 having a hysteresis function, and a mobile phone battery 303, wherein:

power input terminals of the mobile phone baseband module 301 and the battery voltage detection module 302 are coupled with an anode of the battery 303, and a detection signal output terminal of the battery voltage detection module 302 is coupled with a communication terminal of the mobile phone baseband module 301;

the battery voltage detection module 302 detects an output voltage of the anode of the battery 303 and outputs a mobile phone battery voltage detection signal to the mobile phone baseband module 301 through the detection signal output terminal; and the mobile phone baseband module 301 receives the mobile phone battery voltage detection signal through the communication terminal and indicates the voltage of the battery according to the mobile phone battery voltage detection signal.

In implementation, the voltage indicating circuit for a mobile phone battery comprises the mobile phone baseband module 301, the battery voltage detection module 302 having the hysteresis function, and the mobile phone battery 303, wherein the mobile phone battery 303 is coupled with other respective modules, and the detection signal output terminal of the battery voltage detection module 302 having the hysteresis function is coupled with the communication terminal of the mobile phone baseband module 301.

In implementation, the mobile phone battery 303 supplies power to the mobile phone baseband module 301 and the battery voltage detection module 302.

Specifically, the mobile phone battery 303 is coupled with respective modules to supply power to the respective modules.

Specifically, the battery voltage detection module 302 having the hysteresis function can be used for detecting and judging the current voltage of the battery to determine in which preset range the voltage is located, and outputting the corresponding detection signal to the mobile phone baseband module 301. That is, the detection signal output terminal of the battery voltage detection module 302 comprises at least two interrupt signal output terminals, the communication terminal of the mobile phone baseband module 301 comprises at least two signal receiving terminals, and the interrupt signal output terminals and the signal receiving terminals are connected in a one-to-one correspondence way.

The battery voltage detection module 302 outputs a group of corresponding interrupt signals through the at least two interrupt signal output terminals according to the position of the detected voltage of the battery in preset different voltage ranges, and the mobile phone baseband module 301 judges the position of the voltage of the battery in the preset different voltage ranges according to the combination of received interrupt signals and displays the range in which the voltage of the battery is located according to the judgement result.

Specifically, when the voltage of the mobile phone battery changes, the battery voltage detection module 302 having the hysteresis function outputs a group of corresponding interrupt signals to the mobile phone baseband module 301 according to the change of the voltage of the battery, and the mobile phone baseband module 301 acquires the range in which the voltage of the battery is located according to this group of interrupt signals and refreshes the icon display of the interface. For example, when there are two detection signal output terminals, the corresponding relationship between the combination of the interrupt signals and the corresponding range can be: when the two detection signal output terminals output no interrupt signals, i.e., the two detection signal output terminals output interrupt signals with the combination of 00, the voltage of the battery is below V1, the indication is 0 bar; when the two detection signal output terminals output the interrupt signals with the combination of 01, the indication is the first bar; when the two detection signal output terminals output the interrupt signals with the combination of 10, the indication is the second bar; and when the two detection signal output terminals output the interrupt signals with the combination of 11, the indication is the third bar. The specific quantity, combination and corresponding relationship of the interrupt signals can be set flexibly as required.

In implementation, the communication terminal of the mobile phone baseband module 301 can be universal I/O interfaces of the mobile phone baseband main chip.

In implementation, the universal I/O interfaces can be configured in an interruption mode to receive the interrupt signals from the battery voltage detection module 302.

Specifically, the communication terminal of the mobile phone baseband module 301 can be universal I/O interfaces of the mobile phone baseband main chip. Such universal I/O interfaces can be configured in an interruption mode to receive the interrupt signals from the battery voltage detection module 302 having the hysteresis function.

In specific implementation, referring to FIG. 3, the mobile phone battery 303 supplies power to the battery voltage detection module 302 having the hysteresis function and the mobile phone baseband module 301, wherein the battery voltage detection module 302 having the hysteresis function judges the range in which the current voltage of the battery is located according to the change of the voltage of the battery and outputs the judgement result to the universal I/O interfaces of the baseband main chip of the mobile phone baseband module 301, that is, the output ports S1 and S2 of the battery voltage detection module 302 having the hysteresis function are respectively coupled with the universal I/O interfaces, GPIO1 and GPIO2, of the baseband main chip of the mobile phone baseband module 301.

When the voltage of the battery increases and is below V1, both S1 and S2 output high level, and the universal I/O interfaces, GPIO1 and GPIO2, of the baseband main chip detect the input level, judge that the number of bars of the voltage of the battery at this moment should be 0, and refresh the display of the interface as 0 bars. When the voltage of the battery is above V1 but below V2, S1 outputs low level and S2 outputs high level, and the universal I/O interfaces, GPIO1 and GPIO2, of the baseband main chip detect the input level, judge that the number of bars of the voltage of the battery at this moment should be 1, and refresh the display of the interface as 1 bar. When the battery voltage is above V2, both S1 and S2 output low level, and the universal I/O interfaces, GPIO1 and GPIO2, of the baseband main chip detect the input level, judge that the number of bars of the voltage of the battery at this moment should be 2, and refresh the display of the interface as 2 bars.

When the voltage of the battery decreases and is above V3, both S1 and S2 output low level, and the universal I/O interfaces, GPIO1 and GPIO2, of the baseband main chip detect the input level, judge that the number of bars of the voltage of the battery at this moment should be 2, and refresh the display of the interface as 2 bars. When the voltage of the battery is below V3 but above V4, S1 outputs low level and S2 outputs high level, and the universal I/O interfaces, GPIO1 and GPIO2, of the baseband main chip detect the input level, judge that the number of bars of the voltage of the battery at this moment should be 1, and refresh the display of the interface as 1 bar. When the voltage of the battery is below V4, both S1 and S2 output high level, and the universal I/O interfaces, GPIO1 and GPIO2, of the baseband main chip detect the input level, judge that the number of bars of the battery voltage at this moment should be 0, and refresh the display of the interface as 0 bars.

In implementation, the battery voltage detection module 302 can output detection signals of S1 and S2 by taking a Voltage of Battery (VBAT) as the input.

Figure 4:
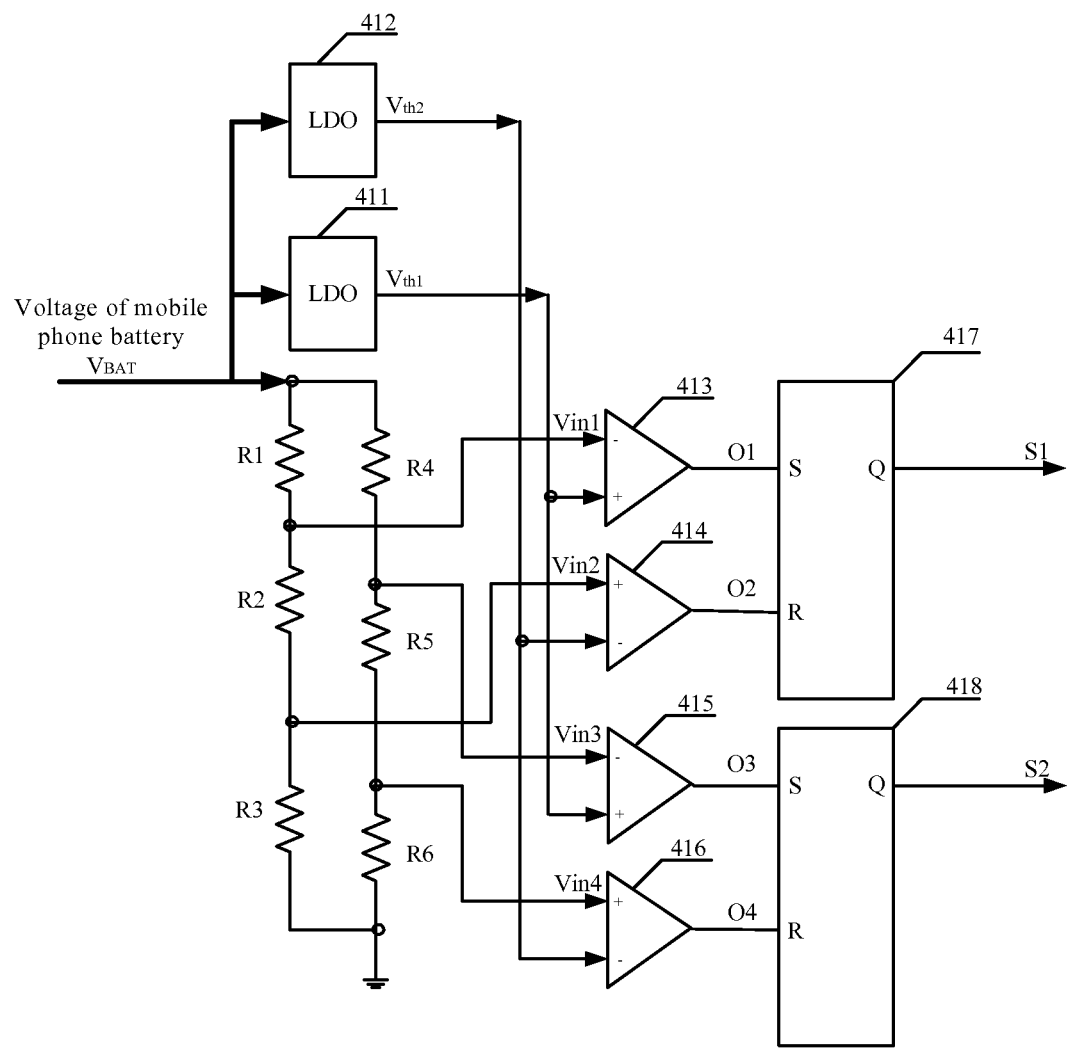
FIG. 4 is a schematic diagram showing the circuit of a battery voltage detection module having a hysteresis function in accordance with an embodiment of the present invention.

FIG. 4 is a schematic diagram showing the circuit of the battery voltage detection module having the hysteresis function. As shown in FIG. 4, in implementation, the battery voltage detection module can comprise:

a first Low Dropout Regulator (LDO) 411 with an input terminal coupled with the anode of the battery and an output terminal being $V_{th1}$;

a second LDO 412 with an input terminal coupled with the anode of the battery and an output terminal being $V_{th2}$;

resistors R1, R2 and R3 coupled in series to form a first branch, wherein one terminal of the first branch is coupled with the anode of the battery and the other terminal of the first branch is grounded, and the voltage of the battery is output as $V_{in1}$ and $V_{in2}$ after being divided by the first branch;

resistors R4, R5 and R6 coupled in series to form a second branch, wherein one terminal of the second branch is coupled with the anode of the battery and the other terminal of the second branch is grounded, and the voltage of the battery is output as $V_{in3}$ and $V_{in4}$ after being divided by the second branch;

a first voltage comparator 413 with an in-phase input terminal coupled with $V_{th1}$, an inversed-phase input terminal coupled with $V_{in1}$, and an output terminal being O1;

a second voltage comparator 414 with an in-phase input terminal coupled with $V_{in2}$, an inversed-phase input terminal coupled with $V_{th2}$, and an output terminal being O2;

a third voltage comparator 415 with an in-phase input terminal coupled with $V_{th1}$, an inversed-phase input terminal coupled with $V_{in3}$, and an output terminal being O3;

a fourth voltage comparator 416 with an in-phase input terminal coupled with $V_{in4}$, an inversed-phase input terminal coupled with $V_{th2}$, and an output terminal being O4;

a first RS trigger 417 with an S interface coupled with O1, an R interface coupled with O2, and an output terminal being one interrupt signal output terminal of the battery voltage detection module; and a second RS trigger 418 with an S interface coupled with O3, an R interface coupled with O4, and an output terminal being the other interrupt signal output terminal of the battery voltage detection module.

In implementation, referring to FIG. 4, it can be seen that the battery voltage detection module having the hysteresis function outputs detection signals of S1 and S2 by taking the voltage of the battery, $V_{BAT}$, as the input. The first LDO 411 and the second LDO 412 are low dropout regulators, with the input voltage being $V_{BAT}$, and output voltage being $V_{th1}$ and $V_{th2}$ respectively. $V_{in1}$ and $V_{in2}$ are the values obtained by dividing $V_{BAT}$ through resistors R1, R2 and R3, and $V_{in3}$ and $V_{in4}$ are the values obtained by dividing $V_{BAT}$ through resistors R4, R5 and R6. The first voltage comparator 413, the second voltage comparator 414, the third voltage comparator 415 and the fourth voltage comparator 416 are four voltage comparators, wherein the in-phase input terminal of the first voltage comparator 413 is $V_{th1}$, the reversed-phase input terminal of the first voltage comparator 413 is $V_{in1}$, and the output of the first voltage comparator 413 is O1; the in-phase input terminal of the second voltage comparator 414 is $V_{in2}$, the reversed-phase input terminal of the second voltage comparator 414 is $V_{th2}$, and the output of the second voltage comparator 414 is O2; the in-phase input terminal of the third voltage comparator 415 is $V_{th1}$, the reversed-phase input terminal of the third voltage comparator 415 is $V_{in3}$, and the output of the third voltage comparator 415 is O3; the in-phase input terminal of the fourth voltage comparator 416 is $V_{in4}$, the reversed-phase input terminal of the fourth voltage comparator 416 is $V_{th2}$, and the output of the fourth voltage comparator 416 is O4. The first RS trigger 417 and the second RS trigger 418 are RS triggers. The working process of the whole circuit can be as follows.

Suitable R1, R2, R3, R4, R5 and R6, the output $V_{th1}$ of LDO 411 and the output $V_{th2}$ of LDO 412 are selected, so as to obtain the following:

$$V4 \cdot \frac{R2+R3}{R1+R2+R3} = V_{th1},$$

$$V1 \cdot \frac{R3}{R1+R2+R3} = V_{th2},$$

$$V3 \cdot \frac{R5+R6}{R4+R5+R6} = V_{th1},$$

$$V2 \cdot \frac{R6}{R4+R5+R6} = V_{th2}.$$

When the voltage of the battery increases:

when $V_{BAT} \leq V4$, $V_{th1} \geq V_{in1}$, $V_{th2} > V_{in2}$, $V_{th1} > V_{in3}$, $V_{th2} > V_{in4}$, at this time, O1 is high level, O2 is low level, O3 is high level, and O4 is low level, then S1 and S2 are both high level;

when $V4 < V_{BAT} \leq V1$, $V_{th1} < V_{in1}$, $V_{th2} \geq V_{in2}$, $V_{th1} > V_{in3}$, $V_{th2} > V_{in4}$, at this time, O1 is low level, O2 is low level, O3 is high level, and O4 is low level, then S1 and S2 are still high level;

when $V1 < V_{BAT} \leq V3$, $V_{th1} < V_{in1}$, $V_{th2} < V_{in2}$, $V_{th1} \geq V_{in3}$, $V_{th2} > V_{in4}$, at this time, O1 is low level, O2 is high level, O3 is high level, and O4 is low level, then S1 is inverted to low level and S2 is still high level;

when $V3 < V_{BAT} \leq V2$, $V_{th1} < V_{in1}$, $V_{th2} < V_{in2}$, $V_{th1} < V_{in3}$, $V_{th2} \geq V_{in4}$, at this time, O1 is low level, O2 is high level, O3 is low level, and O4 is low level, then S1 is still low level and S2 is still high level; and when $V2 < V_{BAT} < 4.2V$, $V_{th1} < V_{in1}$, $V_{th2} < V_{in2}$, $V_{th1} < V_{in3}$, $V_{th2} < V_{in4}$, at this time, O1 is low level, O2 is high level, O3 is low level, and O4 is high level, then S1 and S2 are both low level.

Similarly, when the voltage of the battery decreases, the output results of S1 and S2 are as follows:

when $V3 \leq V_{BAT} < 4.2V$, S1 and S2 are both low level;

when $V4 \leq V_{BAT} < V3$, S1 is still low level, and S2 is inverted to high level; and when $V_{BAT} < V4$, S1 and S2 are both high level.

The above is only an example, and various changes can be made. For example, the input signals of the in-phase input terminals and inversed-phase input terminals of the voltage comparators 413, 414, 415 and 416 can be customized, and the output logics of S1 and S2 will be different according to different definitions.

In addition, by using the integrated circuit technology, this circuit can also be encapsulated in an intelligent card (IC) to be used by a user.

The battery voltage detection module of this embodiment effectively realizes the hysteresis function through the resistors and voltage comparators, so as to avoid the unnecessary change of the graphic display of the voltage of the battery caused by the slight change of the voltage of the battery.

Obviously, various modifications and variations for the present invention can be made by those skilled in the art within the spirit and scope of the present invention. By doing so, if such modifications and variations of the present invention are in the scope of the claims and equivalents thereof, the present invention is intended to include such modifications and variations.

What is claimed is:

1. A voltage indicating circuit for a mobile phone battery, comprising a battery, further comprising a mobile phone baseband module and a battery voltage detection module, wherein power input terminals of the mobile phone baseband module and the battery voltage detection module are coupled with an anode of the battery, and a detection signal output terminal of the battery voltage detection module is coupled with a communication terminal of the mobile phone baseband module;

the battery voltage detection module detects an output voltage of the anode of the battery and outputs a mobile phone battery voltage detection signal to the mobile phone baseband module through the detection signal output terminal; and the mobile phone baseband module receives the mobile phone battery voltage detection signal through the communication terminal and indicates a voltage of the battery according to the mobile phone battery voltage detection signals;

wherein the detection signal output terminal of the battery voltage detection module comprises at least two interrupt signal output terminals, the communication terminal of the mobile phone baseband module comprises at least two signal receiving terminals, and the interrupt signal output terminals and the signal receiving terminals are coupled in a one-to-one correspondence way;

the battery voltage detection module outputs a group of corresponding interrupt signals through the at least two interrupt signal output terminals according to a position of the detected output voltage of the anode of the battery in preset different voltage ranges, and the mobile phone baseband module displays a range in which the voltage of the battery is located according to the group of interrupt signals received.

2. The circuit according to claim 1, wherein there are two interrupt signal output terminals and two signal receiving terminals respectively.

3. The circuit according to claim 1, wherein the communication terminal of the mobile phone baseband module is universal Input/Output (I/O) interfaces of a mobile phone baseband main chip.

4. The circuit according to claim 2, wherein the battery voltage detection module comprises:

a first Low Dropout Regulator LDO (411) with an input terminal coupled with the anode of the battery and an output terminal being Vth1;

a second LDO (412) with an input terminal coupled with the anode of the battery and an output terminal being Vth2;

resistors R1, R2 and R3 coupled in series to form a first branch, wherein one terminal of the first branch is coupled with the anode of the battery and the other terminal of the first branch is grounded, and the output voltage of the anode of the battery is output as Vin1 and Vin2 after being divided by the first branch;

resistors R4, R5 and R6 coupled in series to form a second branch, wherein one terminal of the second branch is coupled with the anode of the battery and the other terminal of the second branch is grounded, and the output voltage of the anode of the battery is output as Vin3 and Vin4 after being divided by the second branch;

a first voltage comparator (413) with an in-phase input terminal coupled with the Vth1, an inversed-phase input terminal coupled with the Vin1, and an output terminal being 01;

a second voltage comparator (414) with an in-phase input terminal coupled with the Vin2, an inversed-phase input terminal coupled with the Vth2, and an output terminal being 02;

a third voltage comparator (415) with an in-phase input terminal coupled with the Vth1, an inversed-phase input terminal coupled with the Vin3, and an output terminal being 03;

a fourth voltage comparator (416) with an in-phase input terminal coupled with the Vin4, an inversed-phase input terminal coupled with the Vth2, and an output terminal being 04;

a first RS trigger (417) with an S interface coupled with the 01, an R interface coupled with the 02, and an output terminal being one interrupt signal output terminal of the battery voltage detection module; and a second RS trigger (418) with an S interface coupled with the 03, an R interface coupled with the 04, and an output terminal being the other interrupt signal output terminal of the battery voltage detection module.

5. The circuit according to claim 2, wherein the communication terminal of the mobile phone baseband module is universal Input/Output (I/O) interfaces of a mobile phone baseband main chip.

\* \* \* \* \*